(12) United States Patent
Hahn et al.

(10) Patent No.: US 9,252,331 B2
(45) Date of Patent: Feb. 2, 2016

(54) THIN-FILM LED HAVING A MIRROR LAYER AND METHOD FOR THE PRODUCTION THEREOF

(75) Inventors: Berthold Hahn, Hemau (DE); Andreas Weimar, Regensburg (DE); Johannes Baur, Regensburg (DE); Matthias Sabathil, Regensburg (DE); Glenn-Ives Plaine, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 689 days.

(21) Appl. No.: 12/680,714

(22) PCT Filed: Sep. 4, 2008

(86) PCT No.: PCT/DE2008/001495
§ 371 (c)(1),
(2), (4) Date: Jul. 7, 2010

(87) PCT Pub. No.: WO2009/039820
PCT Pub. Date: Apr. 2, 2009

(65) Prior Publication Data
US 2010/0283073 A1    Nov. 11, 2010

(30) Foreign Application Priority Data

Sep. 28, 2007  (DE) .......................... 10 2007 046 519

(51) Int. Cl.
| | | |
|---|---|---|
| H01L 33/00 | (2010.01) | |
| H01L 21/00 | (2006.01) | |
| H01L 21/76 | (2006.01) | |
| G01R 31/26 | (2014.01) | |
| H01S 5/00 | (2006.01) | |
| H01S 5/183 | (2006.01) | |
| H01L 33/38 | (2010.01) | |
| H01L 33/10 | (2010.01) | |

(Continued)

(52) U.S. Cl.
CPC ................ *H01L 33/38* (2013.01); *H01L 33/10* (2013.01); *H01L 33/145* (2013.01); *H01L 33/405* (2013.01); *H01L 2924/0002* (2013.01)

(58) Field of Classification Search
USPC .............................. 257/98, 79, 81, 82, 91, 99
See application file for complete search history.

(56) References Cited

U.S. PATENT DOCUMENTS

| | | | |
|---|---|---|---|
| 5,404,031 | A | 4/1995 | Sasaki et al. |
| 6,066,861 | A | 5/2000 | Höhn et al. |
| 6,222,207 | B1 * | 4/2001 | Carter-Coman et al. ....... 257/98 |

(Continued)

FOREIGN PATENT DOCUMENTS

| | | |
|---|---|---|
| DE | 10 2005 003460 | 10/2005 |
| DE | 10 2004 057802 | 6/2006 |

(Continued)

*Primary Examiner* — Mary Wilczewski
*Assistant Examiner* — Tsz Chiu
(74) *Attorney, Agent, or Firm* — Cozen O'Connor

(57) ABSTRACT

A thin-film LED comprising a barrier layer (3), a first mirror layer (2) succeeding the barrier layer (3), a layer stack (5) succeeding the first mirror layer (2), and at least one contact structure (6) succeeding the layer stack (5). The layer stack (5) has at least one active layer (5a) which emits electromagnetic radiation. The contact structure (6) is arranged on a radiation exit area (4) and has a contact area (7). The first mirror layer (2) has, in a region lying opposite the contact area of the contact structure (6), a cutout which is larger than the contact area (7) of the contact structure (6). The efficiency of the thin-film LED is increased as a result.

20 Claims, 1 Drawing Sheet

Figure 1:
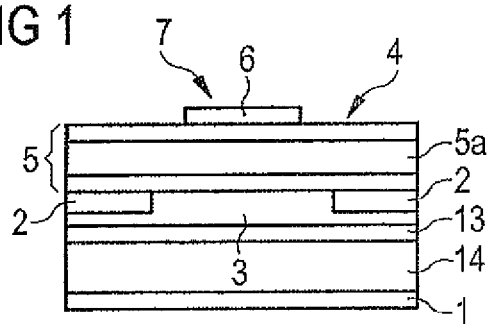

(51) Int. Cl.
*H01L 33/14* (2010.01)
*H01L 33/40* (2010.01)

(56) References Cited

U.S. PATENT DOCUMENTS

| | | |
|---|---|---|
| 7,283,577 B2 | 10/2007 | Schmid et al. |
| 7,583,714 B2 * | 9/2009 | Nakahara et al. ........... 372/45.01 |
| 7,808,583 B2 * | 10/2010 | Wang et al. ..................... 349/96 |
| 2002/0000665 A1 * | 1/2002 | Barr et al. ..................... 257/758 |
| 2003/0006429 A1 * | 1/2003 | Takahashi ............. B82Y 20/00 257/200 |
| 2003/0031221 A1 * | 2/2003 | Wang ................. H01S 5/18366 372/45.01 |
| 2003/0111667 A1 * | 6/2003 | Schubert ........................ 257/98 |
| 2003/0138017 A1 * | 7/2003 | Lee .................... H01S 5/18316 372/46.01 |
| 2003/0178626 A1 | 9/2003 | Sugiyama et al. |
| 2004/0028092 A1 * | 2/2004 | Kim ....................... B82Y 10/00 372/20 |
| 2005/0093008 A1 * | 5/2005 | Suehiro et al. ................. 257/98 |
| 2005/0129076 A1 * | 6/2005 | Widjaja et al. ................. 372/50 |
| 2006/0011935 A1 | 1/2006 | Krames et al. |
| 2006/0060879 A1 | 3/2006 | Edmond |
| 2006/0091411 A1 * | 5/2006 | Ouderkirk et al. .............. 257/98 |
| 2006/0255341 A1 | 11/2006 | Pinnington et al. |
| 2007/0036164 A1 | 2/2007 | Goehler et al. |
| 2007/0069633 A1 | 3/2007 | Kameyama et al. |
| 2007/0114545 A1 | 5/2007 | Jang et al. |
| 2007/0145391 A1 | 6/2007 | Baik et al. |
| 2009/0212307 A1 | 8/2009 | Baur et al. |
| 2009/0230878 A1 * | 9/2009 | Naito ................... H01L 33/025 315/291 |

FOREIGN PATENT DOCUMENTS

| | | |
|---|---|---|
| DE | 10 2005 025416 | 12/2006 |
| EP | 0 772 248 | 5/1997 |
| EP | 1 326 290 | 7/2003 |
| EP | 1 383 177 | 1/2004 |
| JP | 06-104480 | 4/1994 |
| JP | 07-086638 | 3/1995 |
| JP | 08-102549 | 4/1996 |
| JP | 09-237916 | 9/1997 |
| JP | 09-326511 | 12/1997 |
| JP | 11-074559 | 3/1999 |
| JP | 2003-218383 | 7/2003 |
| JP | 2003-282946 | 10/2003 |
| JP | 2004-266240 | 9/2004 |
| JP | 2004-363206 | 12/2004 |
| JP | 2006-086208 | 3/2006 |
| JP | 2006-128227 | 5/2006 |
| JP | 2006-191068 | 7/2006 |
| JP | 2007-059418 | 3/2007 |
| JP | 2007-081088 | 3/2007 |
| JP | 2007-095807 | 4/2007 |
| JP | 2007-103689 | 4/2007 |
| JP | 2007-142420 | 6/2007 |
| JP | 2007-158133 | 6/2007 |
| JP | 2007-165409 | 6/2007 |
| JP | 2007-165612 | 6/2007 |
| JP | 2007-180504 | 7/2007 |
| JP | 2007-207981 | 8/2007 |
| JP | 2007-242669 | 9/2007 |
| WO | WO 98/12757 | 3/1998 |
| WO | WO 2005/071763 | 8/2005 |
| WO | WO 2006/036582 | 4/2006 |
| WO | WO 2006/076210 | 7/2006 |
| WO | WO 2006/080958 | 8/2006 |
| WO | WO 2006/128446 | 12/2006 |
| WO | WO 2007/036164 | 4/2007 |

* cited by examiner

ND METHOD FOR THE PRODUCTION
THIN-FILM LED HAVING A MIRROR LAYER AND METHOD FOR THE PRODUCTION THEREOF

RELATED APPLICATIONS

This is a U.S. national stage of application No. PCT/EP2008/001495, filed on Sep. 4, 2008.

This application claims the priority of German application No. 10 2007 046 519.1 filed Sep. 28, 2007, the entire content of which is hereby incorporated by reference.

FIELD OF THE INVENTION

The invention relates to a thin-film LED comprising a mirror layer, and to a method for producing it.

SUMMARY OF THE INVENTION

One object of the invention is to provide a thin-film LED which is efficient with regard to coupling out radiation and which is distinguished in particular by a reduced absorption of radiation in the contact layers, and a method for producing it.

This and other objects are attained in accordance with one aspect of the present invention directed to a thin-film LED comprising a barrier layer, a first mirror layer succeeding the barrier layer, a layer stack succeeding the first mirror layer and having at least one active layer which emits electromagnetic radiation, and a contact structure succeeding the layer stack. The contact structure is arranged on a radiation exit area of the thin-film LED and has a contact area. The first mirror layer has, in a region laying opposite the contact area of the contact structure, a cutout which is larger than the contact area of the contact structure.

The first mirror layer is therefore structured in such a way that a region of the barrier layer which is not covered by the first mirror layer and which is larger than the contact area of the contact structure lies opposite the contact area of the contact structure in a vertical direction.

In one configuration of the thin-film LED, the barrier layer, in the region of the cutout of the first mirror layer, can directly adjoin an interface of the layer stack which lies opposite the contact structure.

The contact structure can comprise a bonding pad and/or a plurality of contact webs which are electrically connected to the bonding pad, in order to obtain better current spreading. A comparatively homogeneous current distribution in the thin-film LED can be achieved by means of an arrangement comprising a plurality of contact webs which are electrically conductively connected to the bonding pad.

When a bonding pad is used, the contact area of the contact structure is understood hereinafter to mean a main area of the bonding pad. When a bonding pad comprising a plurality of contact webs which are electrically connected to the bonding pad is used, the contact area is understood hereinafter to mean the entire main area formed by the bonding pad and the contact webs.

The first mirror layer can be embodied as a reflective contact layer, wherein the first mirror layer has a cutout in a region lying opposite the contact area of the contact structure. The first mirror layer lying opposite the radiation exit area as seen from the active layer is therefore structured in such a way that a region of the main area of the layer stack which is not covered by the first mirror layer lies opposite the contact structure in a vertical direction as seen from the active layer.

Since the cut-out region does not have a first mirror layer acting as a reflective contact layer, no electrical contact at the adjoining layer stack arises in the cutout. As a result, the current flow is reduced between the contact structure on the radiation exit area and the cutout in the region of the layer stack which lies, in a vertical direction, below and directly alongside the contact area of the contact structure. The generation of radiation in this region of the active layer is thus reduced, whereby the absorption of radiation within the contact structure is advantageously reduced. Furthermore, the proportion of the emitted radiation which is reflected by the first mirror layer in the direction of the contact structure is reduced by the cutout of the first mirror layer. The absorption of radiation in the contact structure is further reduced in this way. The efficiency of the thin-film LED is advantageously increased as a result.

The LED according to an embodiment of the invention is a thin-film LED. In the case of a thin-film LED, the production substrate on which the layer stack for the LED was produced, in particular deposited, is removed in regions or completely. The production substrate is preferably the growth substrate on which the layer stack was grown epitaxially. The production substrate is preferably removed in such a way that the surface of the layer stack which faces the production substrate is accessible to further processing.

Preferably, the lateral extent of the cutout of the first mirror layer is 5 µm to 20 µm larger than the lateral extent of the contact area of the contact structure.

The cutout makes it possible to achieve a reduction of the current density in the region of the active layer which lies, in a vertical direction, below the contact area of the contact structure and in the region which lies, in a vertical direction, directly alongside the contact area of the contact structure. This means that a spatial separation between regions of the active layer in which generation of light takes place and regions of the active layer in which only little or preferably no generation of light takes place is achieved. The regions with little generation of light lie directly below and directly alongside the contact area of the contact structure which has an absorbent effect for the radiation emitted by the active layer. The spatial separation reduces the proportion of the radiation emitted by the active layer which is absorbed by the contact structure. The efficiency of the thin-film LED is advantageously increased as a result.

A lateral extent of the cutout which is enlarged by more than 20 µm with respect to the lateral extent of the contact area is also possible as an alternative. As a result, although the coupling-out of light of the thin-film LED is not influenced disadvantageously, a lateral extent of the cutout which is enlarged by more than 20 µm results in an increased diode voltage, which has the consequence of a reduced efficiency of the active layer.

In a further embodiment of the invention it is provided that an interface of the layer stack which lies opposite the radiation exit area is altered in the region of the cutout in such a way that the contact resistance between the layer stack and the cut-out region of the first mirror layer is increased.

In a farther embodiment of the invention the interface of the layer stack which lies opposite the radiation exit area is altered in the region of the cutout in such a way that the interface of the layer stack is not electrically conductive in the region of the cutout.

In a further embodiment of the invention it is provided that a main area of the contact structure which faces the layer stack has a reflective layer. Particularly preferably, the reflective layer contains Ag, Al and/or Pt.

Preferably, the interface of the layer stack is altered in the region of the cutout in such a way that the contact resistance between the layer stack and the cut-out region of the first mirror layer is increased; particularly preferably, the interface of the layer stack is not electrically conductive in the region of the cutout, wherein the cutout of the first mirror layer has a second mirror layer.

The altered interface of the layer stack reduces the current density in the region of the active layer which lies, in a vertical direction, below and directly alongside the contact area of the contact structure, such that less radiation is generated below the contact area of the contact structure. By means of the second mirror layer situated in the cutout of the first mirror layer and thus on the interface of the layer stack, the proportion of the emitted radiation which is reflected in the direction of the cutout of the first mirror layer is reflected at the second mirror layer in the direction of the radiation exit area. As a result, said proportion of the emitted radiation can be coupled out at the radiation exit area of the thin-film LED. The efficiency of the thin-film LED is advantageously increased in this way.

In a further preferred configuration of the invention it is provided that a main area of the contact structure which faces the layer stack has a reflective layer. Particularly preferably, the reflective layer contains Ag, Al and/or Pt.

By means of the reflective layer on the main area of the contact structure which faces the layer stack, the proportion of the emitted radiation which is reflected by the second mirror layer in the direction of the main area of the contact structure is reflected back in the direction of the first or the second mirror layer. Said proportion of the emitted radiation is in turn reflected at the first or the second mirror layer in the direction of the radiation exit area of the thin-film LED. In this way, the absorption of radiation in the contact structure is reduced; particularly preferably, no emitted radiation is absorbed by the contact structure. The efficiency of the thin-film LED is advantageously increased as a result.

Preferably, the radiation exit area of the layer stack is roughened. The roughening of the radiation exit area reduces the reflectivity at the interface between the layer stack and a medium surrounding the layer stack. As a result, a higher proportion of the radiation which impinges on the interface is coupled out from the layer stack. The proportion of the radiation emitted by the active layer which is reflected back at the radiation exit area in the direction of the active layer is reduced. The efficiency of the thin-film LED is advantageously increased.

In a further embodiment of the invention it is provided that the regions of the layer stack on which the contact structure is arranged have a smaller layer height than regions of the layer stack on which no contact structure is arranged. A further increase in the intensity of the radiation emitted by the layer stack can be achieved as a result.

Preferably, the layer stack on which no contact structure is applied has a layer height of between 4 µm and 8 µm, particularly preferably of 6 µm. The regions of the layer stack to which the contact structure is applied preferably have a layer height of between 50 nm and 3.5 µm, particularly preferably in the range of 100 nm and 2 µm.

Preferably, at least one of the side areas of the layer stack has a further reflective layer. As a result, the proportion of the emitted radiation which, without the at least one further reflective layer, would be coupled out laterally from the layer stack is reflected in the direction of the layer stack. As a result of further reflections in the layer stack, said proportion of the emitted radiation can be reflected in the direction of the radiation exit area and be coupled out. The efficiency of the thin-film LED is advantageously increased further as a result.

Preferably, the further reflective layer applied at at least one of the side areas of the layer stack contains Ag, Al and/or Pt.

In a further embodiment of the invention, a luminescence conversion layer is applied on at least one partial region of the radiation exit area of the thin-film LED. The luminescence conversion layer contains at least one luminescence conversion substance which is suitable for the wavelength conversion of at least one part of the radiation emitted by the thin-film LED toward higher wavelengths. In this way, in particular with a thin-film LED which emits ultraviolet or blue radiation, white light can be generated by wavelength conversion of part of the emitted radiation into the complementary spectral range, for example the yellow spectral range. Suitable luminescence conversion substances, such as YAG:Ce, for example, are known from WO 98/12757, the content of which is hereby incorporated by reference, in particular with regard to phosphors.

A further advantage of a luminescence conversion layer applied on the radiation exit area arises by virtue of the fact that the efficiency of the thin-film LED is advantageously improved since the number of back-reflections of the radiation emitted by the active layer in the direction of the layer stack is further reduced by the luminescence conversion layer. This is based on the fact that the difference in refractive index between layer stack and luminescence conversion layer is preferably less than the difference in refractive index between layer stack and the medium surrounding the layer stack. As a result of a smaller difference in refractive index at the radiation exit area, the proportion of radiation which is coupled out from the layer stack is increased.

Preferably, the layer stack of the thin-film LED is based on a nitride compound semiconductor. In the present context, "based on nitride compound semiconductors" means that the active epitaxial layer sequence or at least one layer thereof comprises a nitride III/V compound semiconductor material, preferably $Al_nGa_mIn_{1-n-m}N$, where $0 \leq n \leq 1$, $0 \leq m \leq 1$ and $n+m \leq 1$. In this case, this material need not necessarily have a mathematically exact composition according to the above formula. Rather, it can comprise one or more dopants and additional constituents which substantially do not change the characteristic physical properties of the $Al_nGa_mIn_{1-n-m}N$ material. For the sake of simplicity, however, the above formula only includes the essential constituents of the crystal lattice (Al, Ga, In, N), even if these can be replaced in part by small amounts of further substances.

The first and/or second mirror layer preferably contains Al and/or Pt, particularly preferably Ag. The barrier layer preferably contains TiWN.

The active layer of the thin-film LED preferably comprises a pn junction, a double heterostructure, a single quantum well or particularly preferably a multiple quantum well structure (MQW) for generating radiation. In this case, the designation quantum well structure does not include any indication about the dimensionality of the quantization. It therefore encompasses, inter alia, quantum wells, quantum wires and quantum dots and any combination of these structures.

Another aspect of the invention is directed to a method for producing a thin-film LED according to the invention comprises the following method steps:

providing a growth substrate,
epitaxially growing a layer stack suitable for generating electromagnetic radiation,
applying a first mirror layer, which has a cutout in a region lying opposite an intended region of a contact structure,
applying a barrier layer on the first mirror layer, stripping the layer stack from the growth substrate,
applying a contact structure, which has a contact area, on the opposite side of the layer stack with respect to the first mirror layer, wherein the contact structure is applied in a region lying opposite the cutout of the first mirror layer, and the contact area of the contact structure is smaller than the cutout of the first mirror layer.

The first mirror layer is therefore structured in such a way that a region of the barrier layer which is not covered by the first mirror layer and which is larger than the contact area of the contact structure lies opposite the contact area of the contact structure in a vertical direction. The first mirror layer is preferably embodied as a reflective contact layer, which preferably produces an ohmic contact with the adjoining layer stack.

The cutout reduces the current density in a region of the active layer which lies, in a vertical direction, below and directly alongside the contact area of the contact structure, such that less radiation is generated by the active layer below the contact area of the contact structure. Furthermore, the proportion of the emitted radiation which is reflected by the first mirror layer in the direction of the contact area of the contact structure is reduced by the cutout of the first mirror layer. The absorption of radiation in the contact structure is reduced in this way. The efficiency of the thin-film LED is advantageously increased as a result.

In one advantageous embodiment of the method it is provided that the interface of the layer stack is damaged before the application of the barrier layer in the region of the cutout of the first mirror layer by means of a plasma process. In particular, it is possible to damage the interface of the layer stack in the region of the cutout of the first mirror layer by means of a sputtering process. Preferably, the interface of the layer stack is damaged in the region of the cutout of the first mirror layer in such a way that the interface of the layer stack is not electrically conductive in this region.

Since the interface of the layer stack is preferably not electrically conductive in the cutout, the current density of the active layer is reduced in the region of the cutout, such that less radiation is generated by the active layer below the contact area of the contact structure. The proportion of the radiation emitted by the active layer which is absorbed by the contact structure is advantageously reduced as a result.

In a further advantageous embodiment of the method it is provided that a second mirror layer is applied to the damaged interface of the layer stack in the cutout of the first mirror layer before the application of the barrier layer. By means of the second mirror layer, the proportion of the emitted radiation which is reflected in the direction of the cutout of the first mirror layer is reflected at the second mirror layer in the direction of the radiation exit area. Said proportion of the emitted radiation can be coupled out at the radiation exit area of the thin-film LED as a result. The efficiency of the thin-film LED is advantageously increased.

In another embodiment, the radiation exit area of the layer stack is roughened before the application of the contact structure. The roughening of the radiation exit area reduces the reflectivity at the radiation exit area, whereby the number of back-reflections at the radiation exit area in the direction of the active layer is reduced. As a result, a larger proportion of the radiation which impinges on the radiation exit area can be coupled out from the thin-film LED. The efficiency of the thin-film LED is advantageously increased.

In a further embodiment of the method it is preferably provided that before the contact structure is applied to the layer stack, a reflective layer is applied to the partial regions of the layer stack which are intended for the contact structure.

As a result, the proportion of radiation which is emitted by the active layer of the thin-film LED and, without the additional reflective layer, would be absorbed by the contact structure is reflected in the direction of the first or the second mirror layer and from the latter again in the direction of the radiation exit area, such that the radiation can be coupled out from the thin-film LED. The efficiency of the thin-film LED is advantageously further increased as a result.

In a further advantageous embodiment of the method it is provided that regions of the layer stack to which the contact structure is applied are treated dry-chemically before the application of the contact structure. This gives rise to regions of the layer stack on which the contact structure is arranged which have a smaller layer height than regions of the layer stack on which no contact structure is arranged. A further increase in the intensity of the radiation emitted by the thin-film LED can be achieved as a result.

In one embodiment of the method it is preferably provided that a further reflective layer is additionally applied to at least one of the side areas of the layer stack. As a result, the proportion of radiation which is emitted laterally by the active layer of the thin-film LED is reflected back in a direction of the layer stack. As a result of further reflections in the layer stack, said proportion of the emitted radiation can be reflected in the direction of the radiation exit area and coupled out. The efficiency of the thin-film LED is advantageously further increased as a result.

BRIEF DESRIPTION OF THE DRAWINGS

Figure 2:
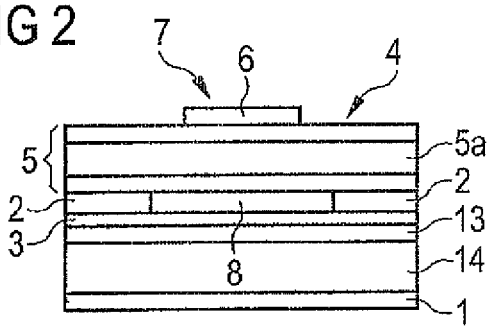
Figure 3:
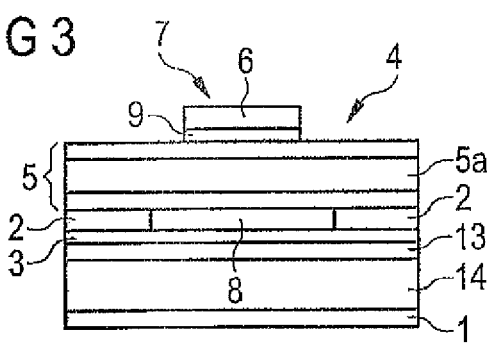
Figure 4:
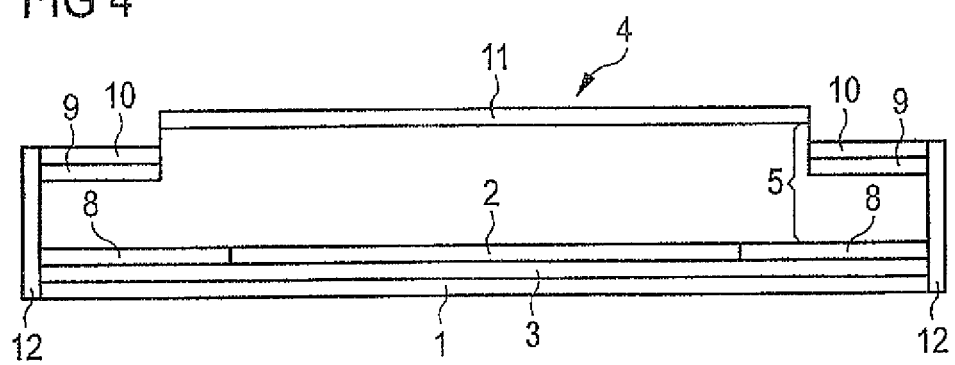

FIG. 1 shows a schematic cross section of a first exemplary embodiment of a thin-film LED according to the invention, FIG. 2 shows a schematic cross section of a second exemplary embodiment of a thin-film LED according to the invention, FIG. 3 shows a schematic cross section of a third exemplary embodiment of a thin-film LED according to the invention, and FIG. 4 shows a schematic cross section of a fourth exemplary embodiment of a thin-film LED according to the invention.

DETAILED DESCRIPTION OF THE DRAWINGS

Identical or identically acting constituent parts are in each case provided with the same reference symbols. The illustrated constituent parts and also the size relationships of the constituent parts among one another should not be regarded as true to scale.

The thin-film LED illustrated in FIG. 1 constitutes a first exemplary embodiment of a thin-film LED. The thin-film LED comprises a barrier layer 3, a succeeding first mirror layer 2 and a layer stack 5 arranged thereon. The layer stack 5 has an active layer 5a, which emits electromagnetic radiation during operation.

A contact structure 6, which is embodied as a bonding pad, is arranged on a radiation exit area 4 and has a contact area 7. The first mirror layer 2 has a cutout in a region lying opposite the contact area 7 of the bonding pad 6, wherein the cutout of the first mirror layer 2 is larger than the contact area 7 of the bonding pad 6.

The first mirror layer 2 is therefore structured in such a way that a region of the barrier layer 3 which is not covered by the first mirror layer 2 lies opposite the contact area 7 of the bonding pad 6 in a vertical direction.

The first mirror layer 2 is embodied as a reflective contact layer which forms a second electrical contact of the thin-film LED, which second electrical contact lies opposite the bonding pad 6 as seen from the active layer 5a.

The thin-film LED is preferably based on a nitride compound semiconductor. The first mirror layer 2 preferably contains Ag. The first mirror layer 2 is encapsulated by a barrier layer 3, which preferably contains TiWN, in order to prevent Ag migration.

The cutout of the first mirror layer 2, and thus of the reflective contact layer, has the advantage that the current density is reduced in a region of the active layer 5a which lies, in a vertical direction, below and directly alongside the contact area 7 of the bonding pad 6, such that less radiation is generated below and directly alongside the contact area 7 of the bonding pad 6, whereby the proportion of the radiation emitted by the active layer 5a which is absorbed by the bonding pad 6 is reduced. Furthermore, the proportion of the emitted radiation which is reflected by the first mirror layer 2 in the direction of the bonding pad 6 is further reduced by the cutout of the first mirror layer 2. The absorption of radiation in the bonding pad 6 is reduced in this way. The efficiency of the thin-film LED is advantageously increased as a result.

Preferably, the lateral extent of the cutout is 5 μm to 20 μm larger than the lateral extent of the contact area 7 of the bonding pad 6. As a result, the current density is suppressed in a region which lies below and directly alongside the bonding pad, acting as absorber, whereby the proportion of the radiation coupled out through the radiation exit area 4 is increased. A lateral extent of the cutout which is enlarged by more than 20 μm with respect to the lateral extent of the contact area 7 is also possible as an alternative. However, this results in an increased diode voltage and thus a reduced efficiency of the active layer 5a.

At an opposite side of the layer stack 5 with respect to the radiation exit area 4, the thin-film LED can be fixed on a carrier 14. By way of example, the layer stack 5 is fixed on the carrier 14 by means of a connecting layer 13, which can be a solder layer, in particular. The carrier 14 is, for example, a circuit board, in particular a printed circuit board. Furthermore, the carrier 14 can be formed from a ceramic, which can contain aluminum nitride, in particular. Carriers 14 composed of a semiconductor material, such as Ge or GaAs carriers, for example, can also be used. A rear side of the carrier 14 which is remote from the layer stack 5 can be provided with an electrical contact layer 1, for example, which forms a second electrical contact of the thin-film LED, which second electrical contact lies opposite the bonding pad 6 as seen from the active layer 5a.

The barrier layer 3 prevents, in particular, a diffusion of material of the connecting layer 13, which is a solder layer, for example, into the first mirror layer 2, which might impair, in particular, the reflection of the first mirror layer 2.

In contrast to the thin-film LED from FIG. 1, the thin-film LED illustrated in FIG. 2 has a second mirror layer 8 in the cutout of the first mirror layer 2, such that the barrier layer 3, which preferably contains TiWN and has an absorbent effect for the radiation emitted by the active layer 5a, does not directly adjoin the layer stack 5 in the region of the cutout of the first mirror layer 2.

The second mirror layer 8 has a high contact resistance with respect to the layer stack 5, while the first mirror layer 2 has a low contact resistance with respect to the layer stack 5. The increased contact resistance and the low conductivity between the layer stack 5 and the second mirror layer 8 arise as a result of an altered interface of the layer stack 5 in the region of the cutout, such that the interface of the layer stack 5 is not electrically conductive in the region of the cutout.

Furthermore, there is the possibility of the second mirror layer 8 having a lower conductivity in comparison with the first mirror layer 2 by virtue of a suitable material.

Since no electrical contact between the second mirror layer 2 and the adjoining layer stack 5 arises in the cut-out region as a result of the change in the interface of the layer stack, the current flow is reduced between the bonding pad 6 on the radiation exit area 4 and the second mirror layer 8 in the region of the layer stack 5 which lies, in a vertical direction, below and directly alongside the contact area 7 of the bonding pad 6. The generation of radiation in this region of the active layer 5a is thus reduced, whereby the absorption of radiation within the bonding pad 6 is advantageously reduced.

The second mirror layer 8 preferably contains Ag. As an alternative, the second mirror layer 8 can contain Pt.

The thin-film LED illustrated in FIG. 3 differs from the thin-film LED illustrated in FIG. 2 in that the main area of the bonding pad 6 which faces the layer stack 5 has a reflective layer 9. The reflective layer preferably contains Ag. As an alternative, the reflective layer can contain Al and/or Pt.

The thin-film LED embodied in FIG. 3 has a first mirror layer 2, which is embodied as a reflective contact layer and which forms a second electrical contact of the thin-film LED, which second electrical contact lies opposite the bonding pad 6 as seen from the active layer 5a.

By means of the reflective layer 9 on the main area of the bonding pad 6 which faces the layer stack, the proportion of the emitted radiation which is reflected by the first or the second mirror layer 2, 8 in the direction of the bonding pad 6 is reflected back in the direction of the first and second mirror layers 2, 8 by the reflective layer 9. Said proportion of the emitted radiation is in turn reflected at the first or the second mirror layer 2, 8 in the direction of the radiation exit area 4 of the thin-film LED and can be coupled out from the thin-film LED through the radiation exit area 4. The absorption of radiation in the bonding pad 6 is reduced further in this way. Preferably, no emitted radiation is absorbed by the bonding pad 6. The efficiency of the thin-film LED is advantageously increased.

The radiation exit area 4 of the thin-film LED is preferably roughened. This roughening reduces the reflectivity of the radiation exit area 4. As a result, a smaller proportion of the radiation emitted by the active layer is reflected back at the radiation exit area 4 in the direction of the active layer 5a, whereby a greater proportion of the radiation emitted by the active layer is coupled out at the radiation exit area 4 and the efficiency of the thin-film LED is increased as a result.

The thin-film LED illustrated in FIG. 4 differs from the thin-film LED in FIG. 3 in that the contact structure is formed from a bonding pad (not illustrated) and contact webs 10. The first mirror layer 2 is cut out below the contact webs 10 and the bonding pad, wherein the lateral extent of the cutouts is greater than the lateral extent of the contact area of the contact structure. The interface of the layer stack 5 is altered in the region of the cutouts of the first mirror layer 2 in such a way that the interface of the layer stack is not electrically conductive in the region of the cutouts. A second mirror layer 8 is in each case arranged in the cutouts.

Furthermore, in contrast to the exemplary embodiment from FIG. 3, a contact layer 1 is arranged on the opposite side of the barrier layer with respect to the first and second mirror layers, which contact layer forms a second electrical contact of the thin-film LED, which second electrical contact lies opposite the contact structure as seen from the active layer 5a.

As a result of the alteration of the interface of the layer stack 5 in regions of the second mirror layer 8, the interface of the layer stack 5 is not electrically conductive, whereby the generation of light in the active layer 5a is reduced in regions below and directly alongside the contact structure. This results in a reduced absorption of the radiation emitted by the active layer 5a in the contact structure.

The side areas of the layer stack 5 have a further reflective layer 12, which preferably contains Ag, Al and/or Pt. Furthermore, a luminescence conversion layer 11 can be applied on the radiation exit area 4 which has no bonding pad or contact webs 10. The luminescence conversion layer 11 contains at least one luminescence conversion substance suitable for the wavelength conversion of at least one part of the radiation emitted by the thin-film LED toward higher wavelengths. In this way, in particular with a thin-film LED which emits ultraviolet or blue radiation, white light can be generated by wavelength conversion of part of the emitted radiation into the complementary spectral range, preferably the yellow spectral range.

The regions of the layer stack 5 to which contact webs 10 are applied preferably have a smaller layer height than regions of the layer stack 5 to which no contact webs 10 are applied. A further increase in the intensity of the radiation emitted by the thin-film LED can be achieved as a result. Preferably, the layer stack 5 on which no contact webs 10 are applied has a layer height of between 4 µm and 8 µm, for example a layer height of 6 µm. The regions of the layer stack 5 to which contact webs 10 are applied preferably have a layer height of between 50 nm and 3.5 µm, for example a layer height of 1 µm.

The reduction of the layer height of the regions of the layer stack 5 to which contact webs 10 are applied is preferably effected dry-chemically. The alteration of the interface of the layer stack 5 is preferably effected by means of a plasma process, particularly preferably by means of a sputtering process.

The description of the exemplary embodiments should not be understood as a limitation to the number of individual layers. Individual layers of the thin-film LED can likewise be composed of a layer sequence. The thin-film LED can likewise contain buffer layers and/or interlayers, for example, in addition to the layers mentioned above.

The explanation of the thin-film LED according to the invention on the basis of the exemplary embodiments described above should not be regarded as a restriction of the invention thereto. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. A thin-film LED, comprising:
    a barrier layer;
    a first mirror layer succeeding the barrier layer;
    a layer stack succeeding the first mirror layer and having at least one active layer which emits electromagnetic radiation; and
    at least one contact structure succeeding the layer stack, arranged on a radiation exit area and having a contact area;
    wherein the first mirror layer has, in a region lying opposite the contact area of the contact structure, a through-hole which is larger than the contact area of the contact structure;
    wherein the barrier layer is configured to prevent a diffusion of material into the first mirror layer; and
    wherein the first mirror layer is arranged between the barrier layer and the layer stack.

2. The thin-film LED as claimed in claim 1, wherein the lateral extent of the through-hole is 5 µm to 20 µm larger than the lateral extent of the contact area of the contact structure.

3. The thin-film LED as claimed in claim 1, wherein an interface of the layer stack which lies opposite the radiation exit area is altered in the region of the through-hole such that the contact resistance between the layer stack and the cut-out region of the first mirror layer is increased.

4. The thin-film LED as claimed in claim 3, wherein the interface of the layer stack which lies opposite the radiation exit area is altered in the region of the through-hole such that the interface of the layer stack is not electrically conductive in the region of the through-hole.

5. The thin-film LED as claimed in claim 1, wherein the through-hole of the first mirror layer has a second mirror layer.

6. The thin-film LED as claimed in claim 1, wherein a main area of the contact structure which faces the layer stack has a reflective layer.

7. The thin-film LED as claimed in claim 1, wherein the radiation exit area of the layer stack is roughened.

8. The thin-film LED as claimed in claim 1, wherein the regions of the layer stack on which the contact structure is arranged have a smaller layer height than regions of the layer stack on which no contact structure is arranged.

9. The thin-film LED as claimed in claim 1, wherein at least one of the side areas of the layer stack has a further reflective layer.

10. The thin-film LED as claimed in claim 1, wherein a luminescence conversion layer is applied on the radiation exit area of the thin-film LED.

11. A method for producing a thin-film LED as claimed in claim 1, comprising the steps of:
    providing a growth substrate;
    epitaxially growing a layer stack suitable for generating electromagnetic radiation;
    applying a first mirror layer, which has a through-hole in a region lying opposite an intended region of a contact structure;
    applying a barrier layer on the first mirror layer, said barrier layer being configured to prevent a diffusion of material into the first mirror layer;
    stripping the layer stack from the growth substrate; and
    applying a contact structure, which has a contact area, on the opposite side of the layer stack with respect to the first mirror layer, wherein the contact structure is applied in a region lying opposite the through-hole of the first mirror layer, and the contact area of the contact structure is smaller than the through-hole of the first mirror layer, and wherein the first mirror layer is arranged between the barrier layer and the layer stack.

12. The method as claimed in claim 11, wherein the interface of the layer stack is damaged before the application of the barrier layer in the region of the through-hole of the first mirror layer via a plasma process or sputtering process.

13. The method as claimed in claim 12, wherein a second mirror layer is introduced into the through-hole of the first mirror layer before the application of the barrier layer.

14. The method as claimed in claim 11, wherein the interface of the layer stack which lies opposite the first mirror layer is roughened before the application of the contact structure.

15. The method as claimed in claim 11, wherein before the contact structure is applied to the layer stack, a reflective layer is applied to the partial regions of the layer stack which are intended for the contact structure.

16. The thin-film LED of claim 1, wherein the through-hole extends over an entire thickness of the first mirror.

17. The thin-film LED of claim 1, wherein the first mirror layer is provided for electrically contacting the layer stack and, on that side of the layer stack adjoining the first mirror layer, no electrical contact is made to the layer stack in the region of the through-hole.

18. The thin-film LED of claim 5, wherein the second mirror layer has a high contact resistance with respect to the layer stack.

19. The thin-film LED of claim 8, wherein the contact structure is at least partially sunken in the layer stack.

20. A thin-film LED, comprising
a barrier layer;
a first mirror layer succeeding the barrier layer;
a layer stack succeeding the first mirror layer and having at least one active layer which emits electromagnetic radiation; and
at least one contact structure succeeding the layer stack, arranged on a radiation exit area and having a contact area;
wherein a section of the barrier layer is uncovered by the first mirror layer, an entirety of the contact area overlaps said section in top view of the thin-film LED, and said section has a larger lateral extent than the contact area;
wherein the barrier layer is configured to prevent a diffusion of material into the first mirror layer; and
wherein the first mirror layer is arranged between the barrier layer and the layer stack.

* * * * *